(12) United States Patent
Chien

(10) Patent No.: US 11,316,480 B2
(45) Date of Patent: Apr. 26, 2022

(54) OPERATIONAL AMPLIFIER

(71) Applicant: RichWave Technology Corp., Taipei (TW)

(72) Inventor: Hwey-Ching Chien, Taipei (TW)

(73) Assignee: RichWave Technology Corp., Taipei (TW)

( * ) Notice: Subject to any disclaimer, the term of this patent is extended or adjusted under 35 U.S.C. 154(b) by 141 days.

(21) Appl. No.: 16/904,506

(22) Filed: Jun. 17, 2020

(65) Prior Publication Data
US 2021/0067101 A1 Mar. 4, 2021

(30) Foreign Application Priority Data

Aug. 27, 2019 (TW) ................................. 108130541

(51) Int. Cl.
*H03F 3/45* (2006.01)
*H03F 1/30* (2006.01)

(52) U.S. Cl.
CPC ............ *H03F 1/302* (2013.01); *H03F 1/306* (2013.01); *H03F 3/4508* (2013.01); *H03F 3/45376* (2013.01); *H03F 3/45071* (2013.01); *H03F 3/45475* (2013.01); *H03F 2200/447* (2013.01)

(58) Field of Classification Search
CPC ........ H03F 1/302; H03F 1/306; H03F 3/4508; H03F 3/45376; H03F 2200/447; H03F 3/45784; H03F 2203/45654; H03F 3/45282; H03F 3/45179; H03F 3/68; H03F 3/45071; H03F 3/45183; H03F 3/45085; H03F 3/45475; H03F 3/45479; H03F 1/34

USPC ......................................... 330/257, 259, 260
See application file for complete search history.

(56) References Cited

U.S. PATENT DOCUMENTS

| | | | |
|---|---|---|---|
| 4,766,394 A | | 8/1988 | Yukawa |
| 5,446,412 A | * | 8/1995 | Kimyacioglu ........ H03F 3/3001 330/253 |
| 5,477,190 A | * | 12/1995 | Brehmer ................. H03F 1/086 330/253 |
| 5,652,545 A | * | 7/1997 | Miyashita ........... H03F 3/45183 330/269 |
| 6,737,841 B2 | | 5/2004 | Wrathall |
| 7,193,448 B2 | * | 3/2007 | Dvorak ................. H03F 3/3023 327/560 |
| 7,893,767 B2 | | 2/2011 | Okuyama |
| 8,970,302 B2 | * | 3/2015 | Schulz ................ H03F 3/45192 330/257 |
| 9,859,856 B1 | * | 1/2018 | Kauffman ........... H03F 3/45183 |

* cited by examiner

*Primary Examiner* — Khanh V Nguyen
(74) *Attorney, Agent, or Firm* — Winston Hsu

(57) ABSTRACT

An operational amplifier includes a voltage terminal; a common terminal; a first amplification stage for receiving a differential signal pair to generate a single-end amplification signal; a first buffer for generating a first voltage according to the single-end amplification signal; a first diode for reducing the first voltage to generate a second voltage; a second amplification stage for amplifying the second voltage to generate a third voltage; a voltage stabilizing circuit for stabilizing the third voltage; a second diode coupled between the second amplification stage and the common terminal; a second buffer for generating an output voltage according to the third voltage; and a current mirror coupled to the common terminal, the first amplification stage, the first diode and the second amplification stage.

20 Claims, 3 Drawing Sheets

OPERATIONAL AMPLIFIER

CROSS REFERENCE TO RELATED APPLICATION

This non-provisional application claims priority of Taiwan patent application No. 108130541, filed on 27 Aug. 2019, included herein by reference in its entirety.

TECHNICAL FIELD

The invention relates to an operational amplifier, and specifically, to an operational amplifier for providing a sufficient amplifier gain.

BACKGROUND

Operational amplifiers are widely adopted in industrial, communications, and consumer electronics fields. The gallium arsenide (GaAs) process offers the advantages of high gains, high bandwidths to applications in the communication fields. However, the gallium arsenide process is hard to manufacture a P-type device. As a result, certain signal processing such as voltage level shifting in a gallium arsenide circuit is difficult to implement. Furthermore, the stability of operational amplifiers fabricated by the GaAs process are hard to maintain when the voltage, temperature or process varies.

Therefore, an operational amplifier fabricated by the GaAs process and capable of providing a sufficient amplifier gain and phase margin while maintaining stability as the voltage, temperature or process varies is in need.

SUMMARY

According to one embodiment of the invention, an operational amplifier includes a voltage terminal; a common terminal; a first amplification stage for receiving a differential signal pair to generate a single-end amplification signal; a first buffer for generating a first voltage according to the single-end amplification signal; a first diode for reducing the first voltage to generate a second voltage; a second amplification stage for amplifying the second voltage to generate a third voltage; a voltage stabilizing circuit for stabilizing the third voltage; a second diode coupled between the second amplification stage and the common terminal; a second buffer for generating an output voltage according to the third voltage; and a current mirror coupled to the common terminal, the first amplification stage, the first diode and the second amplification stage.

DETAILED DESCRIPTION

Figure 1:
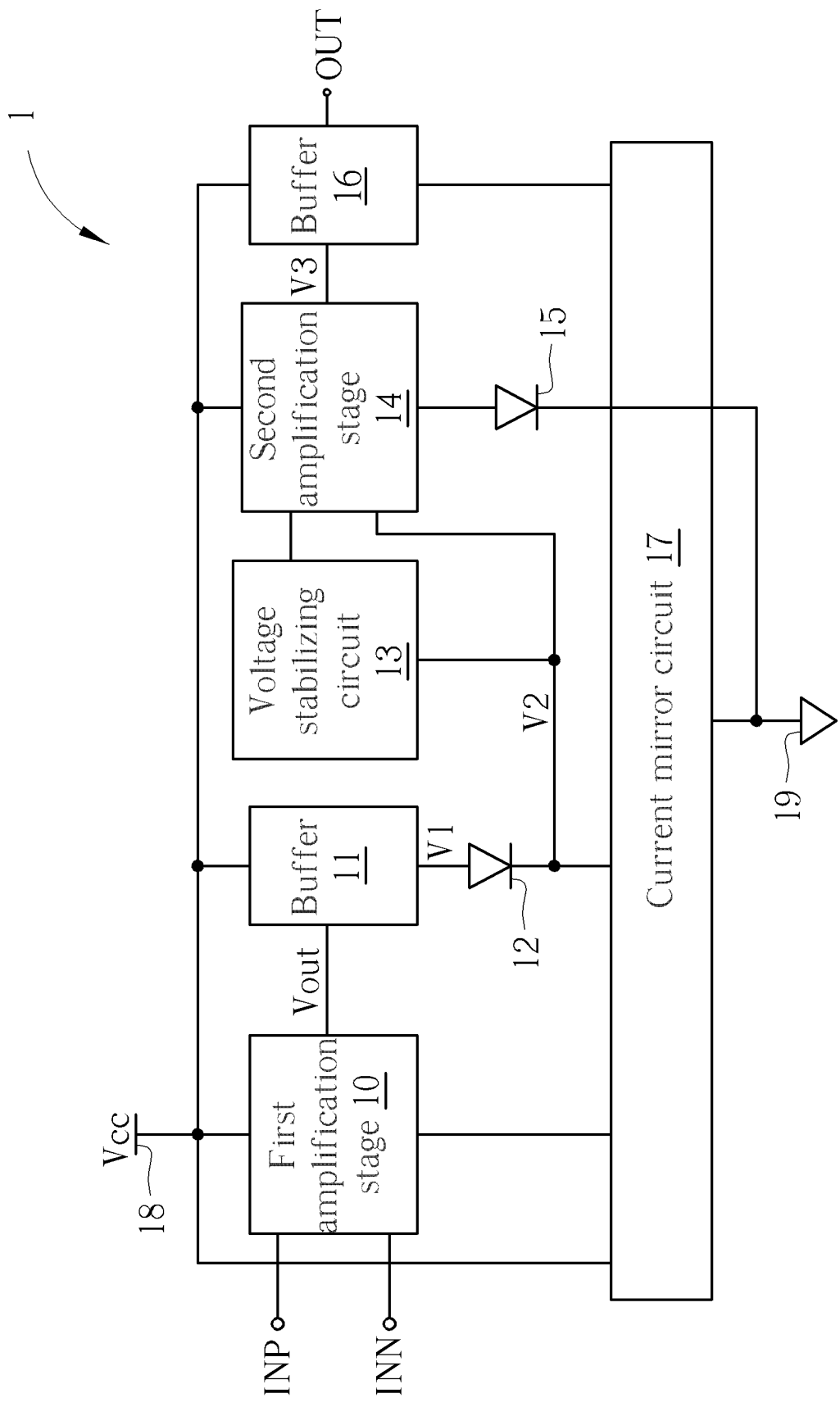
FIG. 1 is a block diagram of an operational amplifier according to an embodiment of the invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 is a block diagram of an operational amplifier 1 according to an embodiment of the invention. The operational amplifier 1 may only adopt the gallium arsenide (GaAs) process, and may adopt metal semiconductor field effect transistors (MESFET), high electron mobility transistors (HEMT), junction gate field-effect transistors (JFET), heterojunction bipolar transistors (HBT), bipolar junction transistors (BJT), capacitors and resistors. The operational amplifier 1 may only comprise N-type transistors or NPN-type transistors. The operational amplifier 1 may receive a differential signal pair INP, INN to generate an output voltage OUT.

The operational amplifier 1 may comprise a voltage terminal 18, a common terminal 19, a first amplification stage 10, a buffer 11, a diode circuit 12, a voltage stabilizing circuit 13, a second amplification stage 14, diode circuit 15, a buffer 16 and a current mirror circuit 17. The first amplification stage 10 may be coupled to the buffer 11. The buffer 11 may be coupled to the voltage stabilizing circuit 13 and the second amplification stage 14 via the diode circuit 12. The voltage stabilizing circuit 13 may be coupled to the diode circuit 12 and the second amplification stage 14. The second amplification stage 14 may be coupled to the diode circuit 15 and the buffer 16. The first amplification stage 10, the buffer 11, the second amplification stage 14, the buffer 16 and the current mirror circuit 17 may be coupled to the voltage terminal 18. The current mirror circuit 17 may be coupled to the common terminal 19, the first amplification stage 10, the diode circuit 12 and the buffer 16. The second diode circuit 15 may be coupled to the common terminal 19.

The voltage terminal 18 may provide a supply voltage Vcc ranging within a predetermined range such as from 3.3V to 5.5V. The common terminal 19 may provide a common voltage at a predetermined level such as 0V. In one embodiment, the common terminal 19 may be the ground terminal. The operational amplifier 1 may employ the first amplification stage 10 and the second amplification stage 14 to provide a sufficient gain to amplify a difference between the differential signal pair INP, INN so as to generate an output voltage OUT. The first amplification stage 10 may be a differential amplifier comprising a transistor pair that receives the differential signal pair INP, INN to generate a single-ended amplification signal Vout. The differential signal pair INP, INN comprises an inverting signal INN and a non-inverting signal INP. The buffer 11 may comprise a first emitter follower or a first source follower, and may generate a first voltage V1 according to the single-ended amplification signal Vout. The diode circuit 12 may comprise at least one diode, e.g., a Schottky diode, or at least one transistor arranged in the diode configuration to perform level shifting, thereby down-converting the first voltage V1 using the forward voltage (e.g., 0.4V) of the diode circuit 12 to generate a second voltage V2. The second voltage V2 after down-conversion may be used to drive the second amplification stage 14 and prevent the second amplification stage 14 from operating in the saturation region. The second amplification stage 14 may be a common emitter amplifier or a common source amplifier, amplifying the second voltage V2 to generate a third voltage V3. The voltage stabilizing circuit 13 may have the function of pole-zero splitting to stabilize the third voltage V3 generated by the second amplification stage 14. Specifically, the voltage stabilizing circuit 13 may generate a primary pole at a lower frequency and push other poles to higher frequencies for increasing the stability of the second amplification stage 14. The diode circuit 15 may comprise at least one diode, e.g., a Schottky diode, or at least one transistor arranged in the diode configuration to perform level shifting for preventing the second amplification stage 14 from being over-driven. The diode circuit 15 may further serve as a degeneration load of the second amplification stage 14. The buffer 16 may comprise a second emitter follower or a second source follower, and generate an output voltage OUT according to the third voltage V3. The current mirror circuit 17 may adjust currents flowing through the first amplification stage 10, the diode circuit 12 and the buffer 16.

Figure 2:
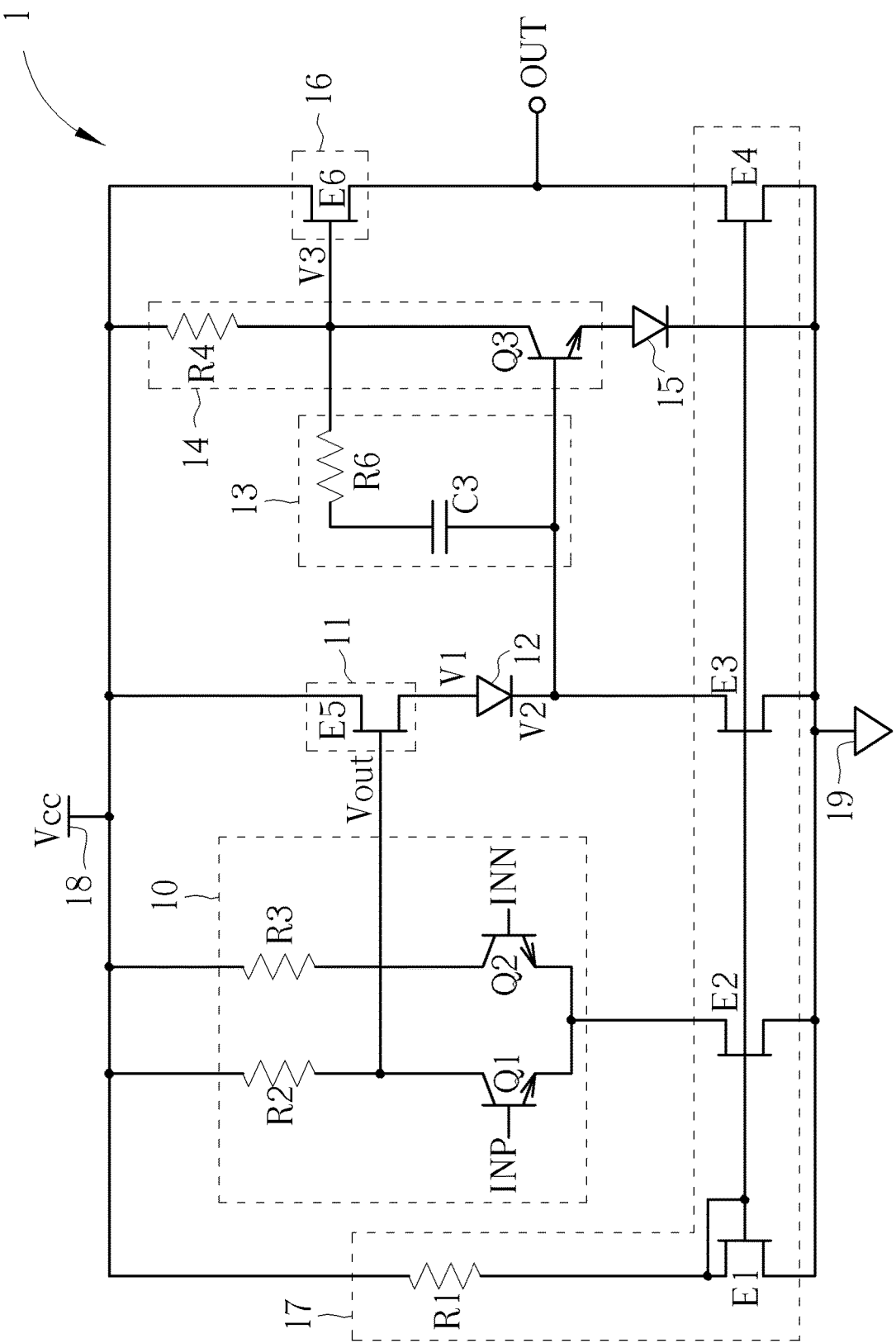
FIG. 2 is an exemplary circuit schematic of the operational amplifier in FIG. 1.

FIG. 2 is an exemplary circuit schematic of the operational amplifier 1. The current mirror circuit 17 may comprise transistors E1, E2, E3, E4, and a resistor R1. The resistor R1 is coupled to the transistor E1 to provide a bias voltage to the transistor E1. The transistor E1 is coupled in the diode configuration, and coupled to the transistors E2, E3, E4 to form current mirrors and adjust currents flowing through the first amplification stage 10, the diode circuit 12 and the buffer 16, respectively. The transistors E1, E2, E3, E4 may be N-type junction gate field-effect transistors, N-type metal semiconductor field effect transistors (MESFETs), pseudomorphic high electron mobility transistors (pHEMTs), or NPN-type bipolar junction transistors. The pseudomorphic high electron mobility transistors may comprise enhancement-mode pseudomorphic high electron mobility transistors (E-pHEMTs) and depletion-mode pseudomorphic high electron mobility transistors (D-pHEMTs).

The first amplification stage 10 comprises a transistor pair and resistors R2, R3. The transistor pair comprises transistors Q1, Q2. The transistor Q1 comprises a first terminal, a second terminal and a control terminal. The control terminal of the transistor Q1 may receive the non-inverting signal INP, the first terminal of the transistor Q1 may be coupled to the voltage terminal 18 via the resistor R2 and output the single-ended amplification signal Vout. The transistor Q2 comprises a first terminal, a second terminal and a control terminal. The control terminal of the transistor Q2 may receive the inverting signal INN. The first terminal of the transistor Q2 may be coupled to the voltage terminal 18 via the resistor R3, and the second terminal of the transistor Q2 may be coupled to the second terminal of the transistor Q1. The second terminal of the transistor Q1 and the second terminal of the transistor Q2 may be coupled to the common terminal 19 via the transistor E2. The resistors R2, R3 may be used to provide the gains of the transistors Q1, Q2, respectively, corresponding to the first gain of the first amplification stage 10. The transistors Q1, Q2 may be N-type heterojunction bipolar transistors, N-type junction gate field-effect transistors, N-type metal semiconductor field effect transistors or N-type pseudomorphic high electron mobility transistors. The first terminals, the second terminals and the control terminals of the transistors Q1, Q2 may be collectors, emitters and bases, respectively, and may be drains, sources and gates, respectively. In some embodiments, the transistors Q1, Q2 may be N-type heterojunction bipolar transistors such as N-type gallium arsenide heterojunction bipolar transistors (GaAs HBTs), and may be operated under higher operating voltages (e.g., above 3V), providing the enhanced gain and enhanced matching. In other embodiments, the transistors Q1, Q2 may be N-type metal semiconductor field effect transistors or pseudomorphic high electron mobility transistors such as gallium arsenide pseudomorphic high electron mobility transistors (GaAs pHEMTs), and may be operated under lower operating voltages (e.g., approximately at 2V).

The buffer 11 may comprise a transistor E5 comprising a first terminal, a second terminal and a control terminal and configured into an emitter follower or a source follower. The transistor E5 may be used to buffer and drive the single-ended amplification signal Vout to generate the first voltage V1 at the second terminal of the transistor E5. The control terminal of the transistor E5 may receive the single-ended amplification signal Vout, the first terminal of the transistor E5 may be coupled to the voltage terminal 18, and the second terminal of the transistor E5 may output the first voltage V1. The diode circuit 12 comprises a first terminal and a second terminal. The first terminal of the diode circuit 12 may be an anode coupled to the second terminal of the transistor E5, and the second terminal of the diode circuit 12 may be a cathode coupled to the common terminal 19 via the transistor E3. The transistor E5 may be an enhancement-mode pseudomorphic high electron mobility transistor.

The second amplification stage 14 comprises a transistor Q3 and a resistor R4. The transistor Q3 comprises a first terminal, a second terminal and a control terminal. The control terminal of the transistor Q3 may receive the second voltage V2, the first terminal of the transistor Q3 may be coupled to the voltage terminal 18 via the resistor R4 to invert and amplify the second voltage V2 to output the third voltage V3. The resistor R4 may be used to provide the gain of the transistor Q3, corresponding to a second gain of the second amplification stage 14. The transistor Q3 may be an N-type heterojunction bipolar transistor, N-type junction gate field-effect transistor, N-type metal semiconductor field effect transistor or N-type pseudomorphic high electron mobility transistor. In one embodiment, the transistors Q1, Q2 and Q3 may all be pseudomorphic high electron mobility transistors or N-type junction gate field-effect transistors. The voltage stabilizing circuit 13 is coupled between the first terminal of the transistor Q3 and the control terminal of the transistor Q3, and comprises a resistor R6 and a capacitor C3 coupled in series. The resistor R6 comprises a first terminal and a second terminal. The first terminal of the resistor R6 is coupled to the first terminal of the transistor Q3. The capacitor C3 comprises a first terminal and a second terminal. The first terminal of the capacitor C3 is coupled to the second terminal of the resistor R6, and the second terminal of the capacitor C3 is coupled to the control terminal of the transistor Q3. The first terminal of the diode circuit 15 may be an anode coupled to the second terminal of the transistor Q3, and the second terminal of the diode circuit 15 may be a cathode coupled to the common terminal 19.

The buffer 16 comprises a transistor E6 comprising a first terminal, a second terminal and a control terminal, and may be configured into an emitter follower or a source follower. The transistor E6 may be used to buffer and drive the third voltage V3 to generate the output voltage OUT at the second terminal of the transistor E6. The control terminal of the transistor E6 may receive the third voltage V3, the first terminal of the transistor E6 may be coupled to the voltage terminal 18, and the second terminal of the transistor E6 may be coupled to the common terminal 19 via the transistor E4 and output the output voltage OUT. The transistor E6 may be a pseudomorphic high electron mobility transistor. In some embodiments, the transistor E6 may be a depletion-mode pseudomorphic high electron mobility transistor having a negative forward voltage to generate a maximal output voltage.

In the embodiment, the operational amplifier 1 may employ the gallium arsenide process, in order to avoid using a P-type component, the operational amplifier 1 may utilize the diode circuit 12 to provide bias matching between the first amplification stage 10 and the second amplification stage 14, preventing the second amplification stage 14 from being operated in the saturation region, and utilize the voltage stabilizing circuit 13 to provide stability while providing a sufficient amplifier gain.

Figure 3:
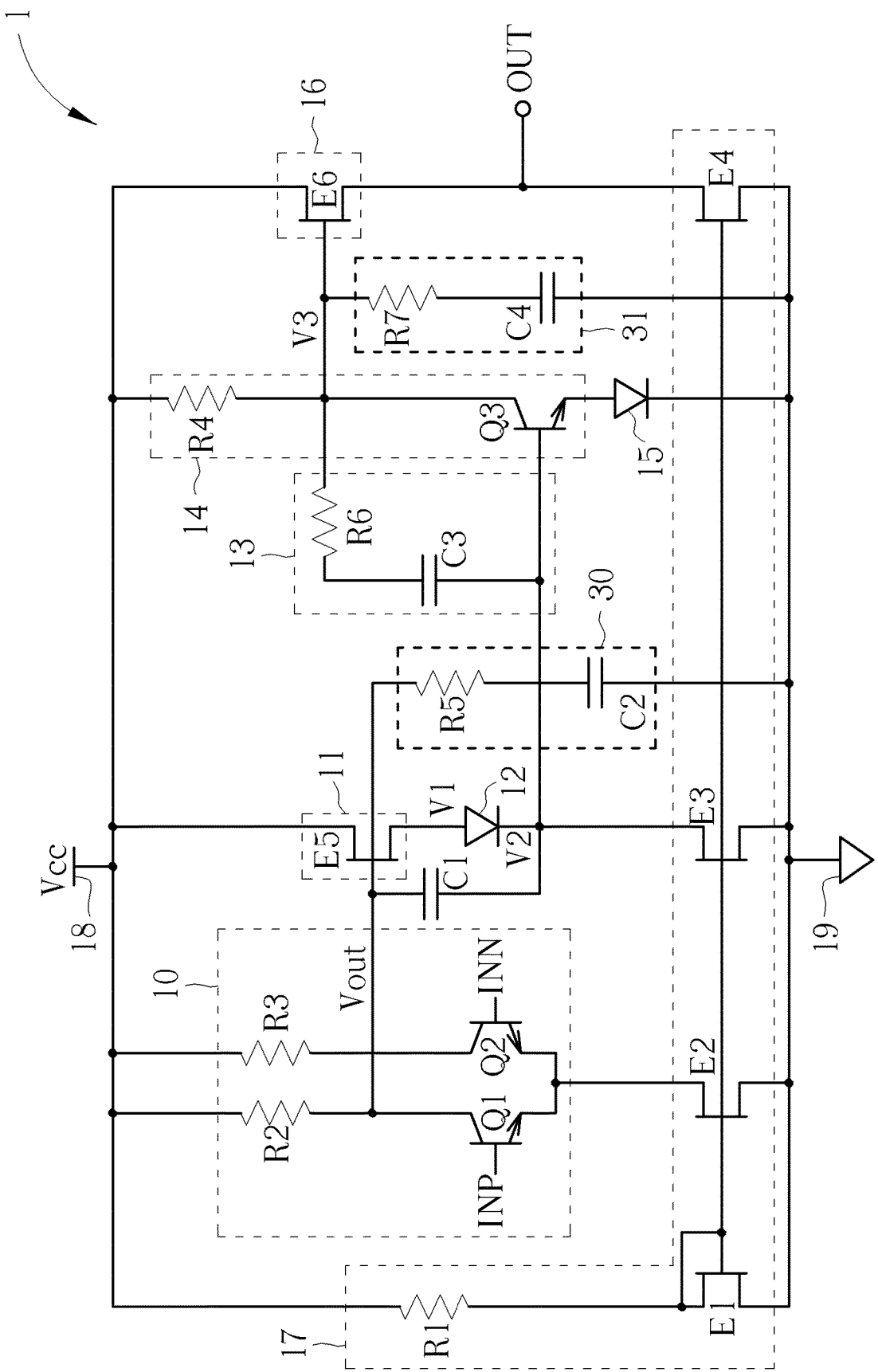
FIG. 3 is another exemplary circuit schematic of the operational amplifier in FIG. 1.

FIG. 3 is another exemplary circuit schematic of the operational amplifier 1. The operational amplifier 1 in FIGS. 2 and 3 have similar structures and operation methods, but the operational amplifier 1 in FIG. 3 further comprises a feedforward capacitor C1, a first phase adjustment circuit 30 and a second phase adjustment circuit 31 to reduce phase delays of signals. The structures and operation principles of other circuit components in the operational amplifier 1 in FIG. 3 are similar to those in FIG. 2, the explanation therefor are omitted for brevity. The explanations for the feedforward capacitor C1, the first phase adjustment circuit 30 and the second phase adjustment circuit 31 are detailed as below.

The feedforward capacitor C1 feeds forwards the single-ended amplification signal Vout from the output terminal of the first amplification stage 10 to the input terminal of the second amplification stage 14, reducing a phase delay of the single-ended amplification signal Vout. The feedforward capacitor C1 has a first terminal and a second terminal. The first terminal of the feedforward capacitor C1 is coupled to the first terminal of the transistor Q1, and the second terminal of the feedforward capacitor C1 is coupled to the second terminal of the diode circuit 12.

The first phase adjustment circuit 30 is coupled between the first amplification stage 10 and the common terminal 19, and may produce a zero for the first amplification stage 10 and adjust a phase of the single-ended amplification signal Vout, thereby reducing a phase delay of the single-ended amplification signal Vout. The first phase adjustment circuit 30 comprises a resistor R5 and a capacitor C2 coupled in series. The resistor R5 comprises a first terminal and a second terminal. The first terminal of the resistor R5 is coupled to the first terminal of the transistor Q1 and the control terminal of the transistor E5. The capacitor C2 comprises a first terminal and a second terminal. The first terminal of the capacitor C2 is coupled to the second terminal of the resistor R5, and the second terminal of the capacitor C2 is coupled to the common terminal 19.

The second phase adjustment circuit 31 is coupled to the second amplification stage 14 and the common terminal 19, and may produce a zero for the second amplification stage 14 and adjust a phase of the third voltage V3, thereby reducing a phase delay of the third voltage V3. The second phase adjustment circuit 31 comprises a resistor R7 and a capacitor C4 coupled in series. The resistor R7 comprises a first terminal and a second terminal. The first terminal of the resistor R7 is coupled to the first terminal of the transistor Q3, the first terminal of the resistor R6 and the control terminal of the transistor E6. The capacitor C4 comprises a first terminal and a second terminal. The first terminal of the capacitor C4 is coupled to the second terminal of the resistor R7, and the second terminal of the capacitor C4 is coupled to the common terminal 19.

Although the feedforward capacitor C1, the first phase adjustment circuit 30 and the second phase adjustment circuit 31 are simultaneously adopted by the operational amplifier 1 in FIG. 3, the invention is not limited thereto. In some embodiments, any one or a combination of the feedforward capacitor C1, the first phase adjustment circuit 30 and the second phase adjustment circuit 31 may be adopted to reduce the phase delays of signals.

In the embodiment, the operational amplifier 1 in FIGS. 1 to 3 may be fabricated using the gallium arsenide process employing no P-type device. Moreover, in order to provide a sufficient amplifier gain, the diode circuit 12 may be utilized to prevent the second amplification stage 14 from being operated in the saturation region, the voltage stabilizing circuit 13 is utilized to provide stability, and the feedforward capacitor C1, the first phase adjustment circuit 30 and the second phase adjustment circuit 31 are utilized to reduce phase delays and increase phase margins.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An operational amplifier comprising:
   a voltage terminal configured to provide a supply voltage;
   a common terminal configured to provide a common voltage;
   a first amplification stage coupled to the voltage terminal, the first amplification stage comprising a transistor pair and configured to receive a differential signal pair to generate a single-ended amplification signal;
   a first buffer coupled to the first amplification stage and the voltage terminal and configured to generate a first voltage according to the single-ended amplification signal;
   a first diode circuit coupled between the first buffer and the common terminal and configured to down-convert the first voltage to generate a second voltage;
   a second amplification stage comprising a second amplification transistor, the second amplification stage being coupled to the first diode circuit and configured to amplify the second voltage to generate a third voltage;
   a stabilizing circuit coupled between the first diode circuit and the second amplification stage, the stabilizing circuit comprising a resistor and a capacitor coupled in series to each other and configured to stabilize the third voltage;
   a second diode circuit coupled between the second amplification stage and the common terminal;
   a second buffer coupled to the second amplification stage and configured to generate an output voltage according to the third voltage; and
   a current mirror circuit coupled to the common terminal, the first amplification stage, the first diode circuit and the second buffer.

2. The operational amplifier of claim 1, further comprising a feedforward capacitor having a first terminal coupled to the first buffer, and a second terminal coupled to a second terminal of the first diode circuit.

3. The operational amplifier of claim 1, further comprising a first phase adjustment circuit coupled between the first amplification stage and the common terminal and configured to adjust a phase of the single-ended amplification signal.

4. The operational amplifier of claim 3, wherein the first phase adjustment circuit comprises:
   a first resistor comprising:
      a first terminal coupled to the first amplification stage and the first buffer; and
      a second terminal; and
   a first capacitor comprising:
      a first terminal coupled to the second terminal of the first resistor; and
      a second terminal coupled to the common terminal.

5. The operational amplifier of claim 1, further comprising a second phase adjustment circuit coupled between the second amplification stage and the common terminal and configured to adjust a phase of the third voltage.

6. The operational amplifier of claim 5, wherein the second phase adjustment circuit comprises:
a second resistor comprising:
a first terminal coupled to the second amplification stage, the stabilizing circuit and the second buffer; and
a second terminal; and
a second capacitor comprising:
a first terminal coupled to the second terminal of the second resistor; and
a second terminal coupled to the common terminal.

7. The operational amplifier of claim 1, wherein:
the current mirror circuit comprises a first transistor, a second transistor, a third transistor and a fourth transistor; and
the first transistor is coupled in a diode configuration and coupled to the second transistor, the third transistor and the fourth transistor to form current mirrors and adjust currents flowing through the first amplification stage, the first diode circuit and the second buffer, respectively.

8. The operational amplifier of claim 7, wherein the first transistor, the second transistor, the third transistor and the fourth transistor are enhancement-mode pseudomorphic high electron mobility transistors (E-pHEMT) or NPN-type bipolar junction transistors (BJT).

9. The operational amplifier of claim 1, wherein the first buffer comprises a first emitter follower or a first source follower, and the second buffer comprises a second emitter follower or a second source follower.

10. The operational amplifier of claim 9, wherein the first buffer and the second buffer are enhancement-mode pseudomorphic high electron mobility transistors.

11. The operational amplifier of claim 1, wherein the first buffer is an enhancement-mode pseudomorphic high electron mobility transistor, and the second buffer is a depletion-mode pseudomorphic high electron mobility transistor (D-pHEMT).

12. The operational amplifier of claim 1, wherein the transistor pair and the second amplification transistor are N-type heterojunction bipolar transistors (HBTs).

13. The operational amplifier of claim 1, wherein the transistor pair and the second amplification transistor are N-type metal semiconductor field effect transistors (MESFETs).

14. The operational amplifier of claim 1, wherein the transistor pair and the second amplification transistor are pseudomorphic high electron mobility transistors (pHEMTs) or N-type junction gate field-effect transistors (JFETs).

15. The operational amplifier of claim 1, wherein the operational amplifier only comprises N-type transistors or NPN-type transistors.

16. The operational amplifier of claim 1, wherein the first diode circuit and the second diode circuit comprise at least one Schottky diode.

17. The operational amplifier of claim 1, wherein:
the differential signal pair comprises an inverting signal and a non-inverting signal; and
the transistor pair comprises:
a first differential amplification transistor comprising a control terminal configured to receive the non-inverting signal, a first terminal configured to output the single-ended amplification signal, and a second terminal; and
a second differential amplification transistor comprising a control terminal configured to receive the inverting signal, a first terminal, and a second terminal coupled to the second terminal of the first differential amplification transistor.

18. The operational amplifier of claim 1, wherein:
the first buffer comprises a fifth transistor comprising a first terminal coupled to the voltage terminal, a second terminal coupled to the first terminal of the first diode circuit, and a control terminal configured to receive the single-ended amplification signal; and
a second buffer comprises a sixth transistor comprising a first terminal coupled to the voltage terminal, a second terminal configured to output the output voltage, and a control terminal configured to receive the third voltage.

19. The operational amplifier of claim 1, wherein:
the first diode circuit comprises a first terminal coupled to the first buffer, and a second terminal coupled to the common terminal; and
the second diode circuit comprises a first terminal coupled to the second amplification transistor, and a second terminal coupled to the common terminal.

20. The operational amplifier of claim 1, wherein operational amplifier is fabricated using a gallium arsenide (GaAs) process.

* * * * *